United States Patent
Lin et al.

(10) Patent No.: US 9,651,857 B2
(45) Date of Patent: May 16, 2017

(54) MASK AND METHOD FOR FORMING THE SAME

(71) Applicant: Taiwan Semiconductor Manufacturing Company, Ltd., Hsin-Chu (TW)

(72) Inventors: Yun-Yue Lin, Hsinchu (TW); Chia-Jen Chen, Jhudong Township, Hsinchu County (TW); Hsin-Chang Lee, Zhubei, Hsinchu County (TW); Ta-Cheng Lien, Cyonglin Township, Hsinchu County (TW); Anthony Yen, Hsinchu (TW)

(73) Assignee: TAIWAN SEMICONDUCTOR MANUFACTURING COMPANY. LTD., Hsin-Chu (TW)

( * ) Notice: Subject to any disclaimer, the term of this patent is extended or adjusted under 35 U.S.C. 154(b) by 132 days.

(21) Appl. No.: 14/637,189

(22) Filed: Mar. 3, 2015

(65) Prior Publication Data

US 2015/0177612 A1    Jun. 25, 2015

Related U.S. Application Data

(62) Division of application No. 13/451,767, filed on Apr. 20, 2012, now Pat. No. 8,974,988.

(51) Int. Cl.
*G03F 1/48* (2012.01)
*G03F 1/22* (2012.01)
*G03F 1/30* (2012.01)
*G03F 1/32* (2012.01)
*G03F 1/50* (2012.01)
*G03F 1/26* (2012.01)

(52) U.S. Cl.
CPC .............. *G03F 1/48* (2013.01); *G03F 1/22* (2013.01); *G03F 1/30* (2013.01); *G03F 1/32* (2013.01); *G03F 1/50* (2013.01); *G03F 1/26* (2013.01)

(58) Field of Classification Search
CPC .......................................... G03F 1/48
USPC .......................................... 430/5
See application file for complete search history.

(56) References Cited

U.S. PATENT DOCUMENTS

| | | | |
|---|---|---|---|
| 7,012,753 | B2 | 3/2006 | Quesnel |
| 7,604,906 | B1 | 10/2009 | Volk et al. |
| 7,763,399 | B2 | 7/2010 | Sengupta et al. |
| 2006/0134534 | A1 | 6/2006 | Dieu et al. |
| 2011/0070534 | A1 | 3/2011 | Hayashi |
| 2011/0287347 | A1 | 11/2011 | Sakai et al. |

*Primary Examiner* — Stephen Rosasco
(74) *Attorney, Agent, or Firm* — Haynes and Boone, LLP

(57) ABSTRACT

A photomask includes a low thermal expansion material (LTEM) substrate, a patterned opaque layer over the LTEM substrate, and a patterned capping layer over the opaque layer. The patterned capping layer includes a transition metal material for suppressing haze growth, such as metal oxide, metal nitride, or metal oxynitride. The material in the capping layer reacts with a hydrogenic compound from a lithography environment to for an atomic level hydrogen passivation layer. The passivation layer has superior ability to suppress photo-induced haze defect growth on the photomask surface, to improve production cycle time and reduce the production cost.

20 Claims, 4 Drawing Sheets

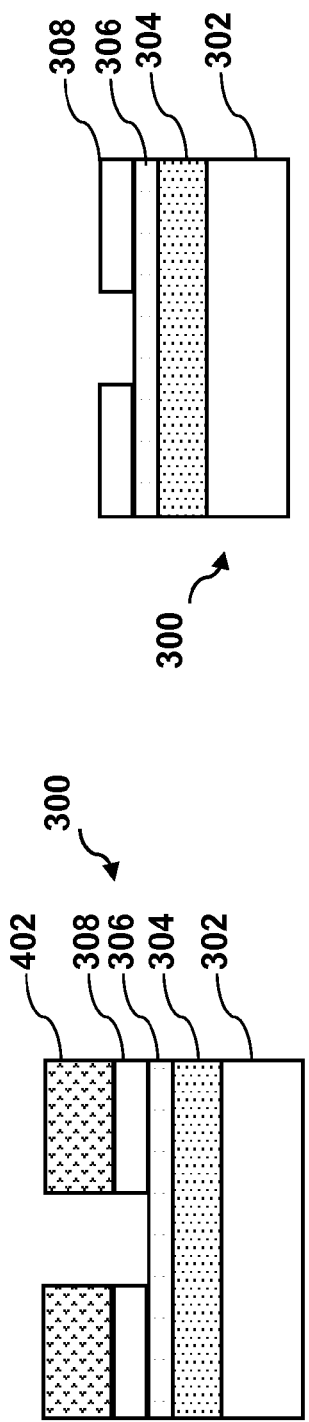
FIG. 6
FIG. 7
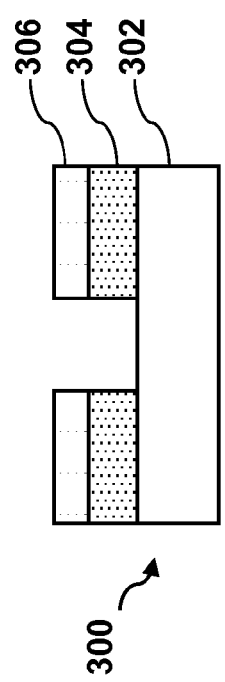
FIG. 8

MASK AND METHOD FOR FORMING THE SAME

PRIORITY DATA

The present application is a divisional application of U.S. patent application Ser. No. 13/451,767, filed Apr. 20, 2012, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the need to perform higher resolution lithography processes grows. One method of many lithography techniques to improve resolution is to use a super binary mask (BIM) or a phase shift mask (PSM). A phase shift masks typically include an alternative phase shift mask (alt. PSM), and an attenuated phase shift mask (att. PSM). Disadvantages of using a phase shift mask are haze defects and haze related crystal growth defects on the photomask. Haze defects and haze related crystal growth defects on a photomask are photo-induced defects during high energy expose, wave length ranging from 450 nm to 13 nm, such as 248 nm deep ultraviolet (DUV) lithography process or 13 nm extreme ultraviolet (EUV) lithography process. The haze defects often require repeated chemical cleaning processes to increase the IC production cycle time and cost. It is desired to have improvements for photomask haze defects reduction.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 3-8 illustrate diagrammatic cross-sectional side views of an embodiment of a photomask at various stages of fabrication, according to the method of FIG. 1.

DETAILED DESCRIPTION

Figure 1:
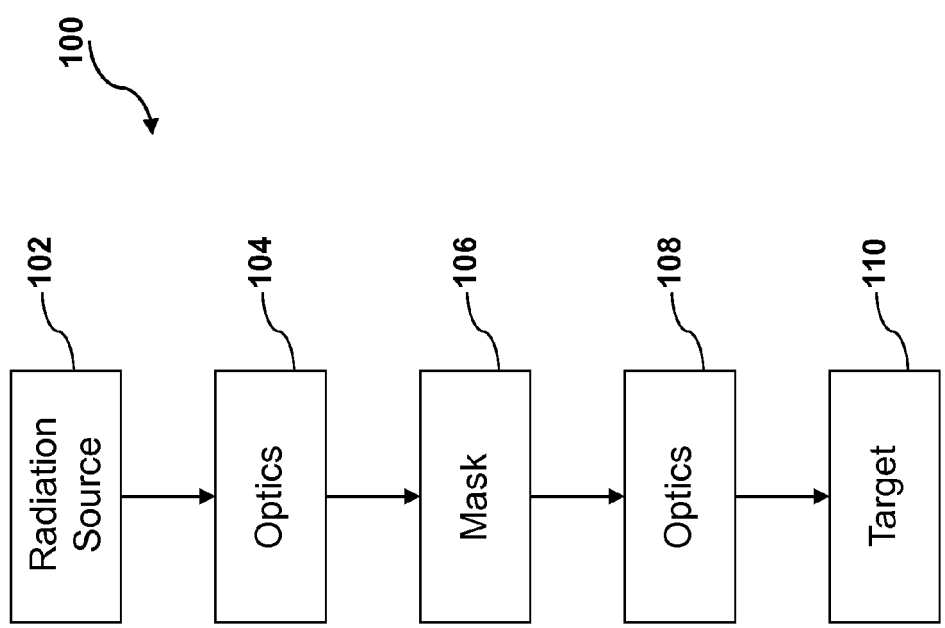
FIG. 1 represents a block diagram of a lithography system for implementing one or more embodiments of the present invention.

The present disclosure relates generally to mask manufacturing and optimization, and more particularly, to a method of suppressing haze or ionic defect growth on photomask surface by modifying a capping layer on a photomask to form a self passivated hydrogenic layer, and the photomask produced by such a method. The photomask includes a super binary mask (BIM) or an alternative phase shift mask (alt. PSM) and an attenuated phase shift mask (att. PSM).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a photolithography system 100 is an example of a system that can benefit from one or more embodiments of the present invention. The photolithography system 100 includes an illumination source 102, a plurality of illumination optics 104, a mask 106 (in the present disclose, the term mask, photomask, and reticle are used to refer to the same item), a plurality of projection optics 108 and a target 110 such as a semiconductor wafer. However, other configurations and inclusion or omission of devices may be possible. In the present embodiment, the illumination source 102 includes a source providing electromagnetic radiation having a wavelength range from UV to DUV. For example, mercury lamps provide UV wavelength, such as G-line (436 nm) and I-line (365 nm), and excimer lasers provide DUV wavelength, such as 248 nm, 193 nm and 157 nm. The illumination optics 104 is configured to guide a radiation beam to the mask 106. The mask 106 may be a binary or a phase shift mask (PSM), which includes an alternative phase shift mask (alt. PSM) and an attenuated phase shift mask (att. PSM) as described in further detail later below. The mask may be positioned on the reticle stage. The electromagnetic radiation beam reflected from the mask 106 (e.g., a patterned radiation beam) is collected by the projection optics 108. The projection optics 108 may be reflective and include a magnification lens for reducing the pattern image to be exposed on the target 110. The projection optics 108 also directs the patterned radiation to the target 110. The target 110 includes a photosensitive layer (e.g., photoresist or resist), which is sensitive to the light radiation. The target 108 may be held on a target substrate stage. The target substrate stage provides control of the target substrate position such that the image of the reticle is transferred onto the target substrate in a repetitive fashion (though other lithography methods are possible). The lithography system 100, or portions thereof, may include additional items, such as a vacuum system and/or a cooling system.

The photolithography system 100 may in a wet (immersion) or dry atmosphere environment. The photolithography surfaces, such as the surface of the photomask 106, surface of the target 110, and/or surface of the optics 104, 108 are susceptible to defect and residue formation. Such defects may include haze, crystal growth, ionic residues, and oxide formation. Haze defect formation is especially problematic for advanced lithography technology that use a phase shift mask (PSM) such as an alternative phase shift mask (alt. PSM) and an attenuated phase shift mask (att. PSM), and short wavelength, high laser radiation energy. Photomask can be cleaned of haze defects by repeated wet chemical cleaning and inspection. However, these processes increase the IC production cycle time the cost. As discussed in detail below, a capping layer is introduced on the photomask. In some embodiments, the materials used in the capping layer react with ionic residue and then form a self-passivated hydrogen capping layer to suppress haze defect growth on the photomask surface.

Figure 2:
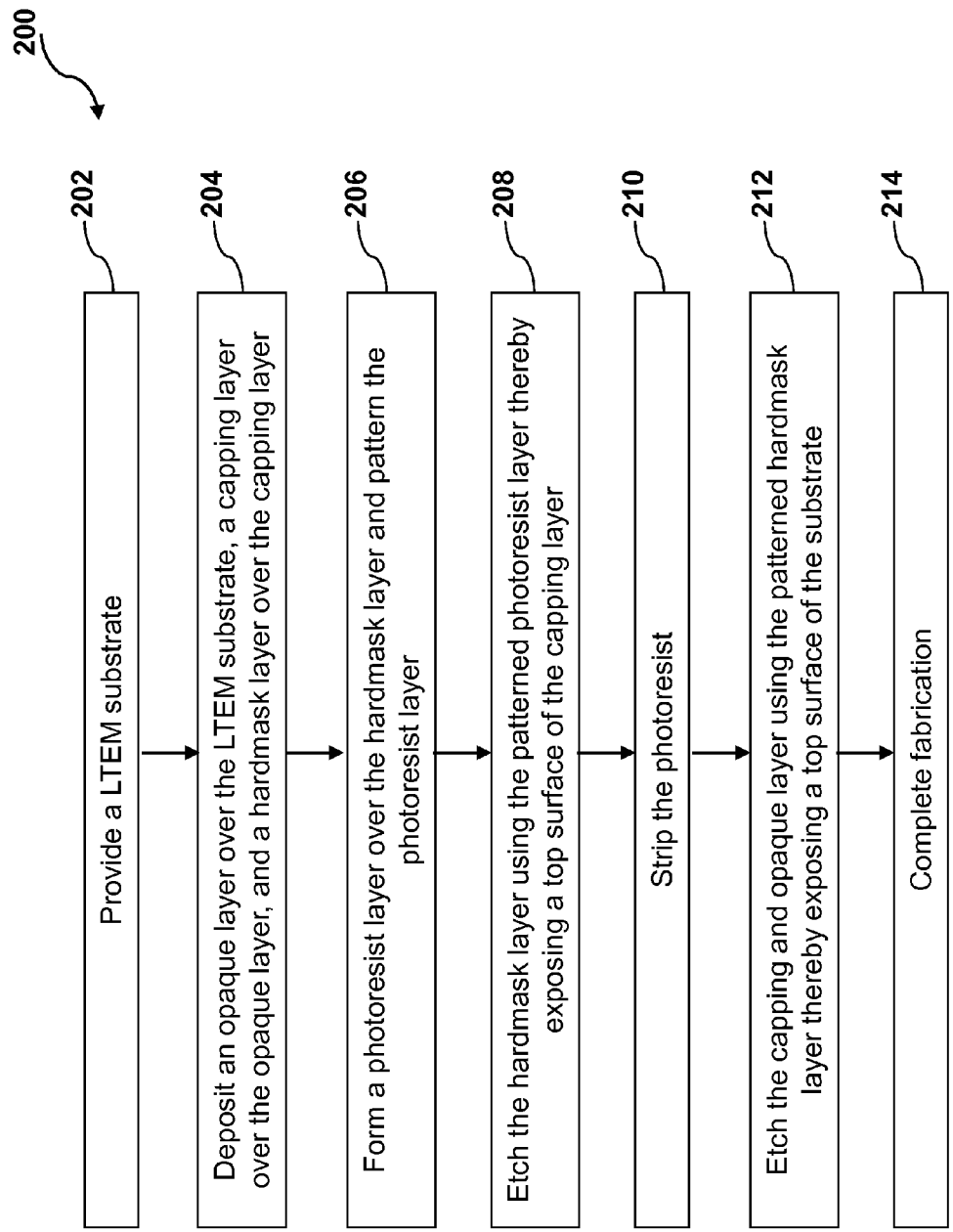
FIG. 2 represents a flowchart illustrating a method of fabricating a photomask according to various aspects of the present disclosure.

Referring now to FIG. 2, a method 200 can be used to fabricate a self passivated hydrogenic capping layer on the photomask 106 for haze defect growth suppression according to an embodiment of the present disclosure. Additional steps can be provided before, during, and after the method 200, and some of the steps described can be replaced or eliminated for other embodiments of the method. Additionally, some steps may be performed concurrently with other steps. The method begins at block 202, where an extremely low thermal expansion material is provided as a substrate. At block 204, an opaque layer, a capping layer and a hard mask layer are sequentially deposited over the substrate to form a blank mask. At block 206, a suitable photoresist is deposited on the blank mask. The photoresist is patterned according to a design for a layer of an integrated circuit (IC) device (or chip). At block 208, the hardmask layer is selectively removed by an etch process, thereby exposing the top surface of the capping layer. At block 110, the photoresist is stripped, thereby forming a hardmask pattern per the design. At block 112, the capping and opaque layer is etched by using the patterned hardmask layer, thereby exposing a top surface of the substrate. At block 114, the fabrication of the self passivated hydrogenic capping layer photomask for haze defect growth suppression is completed. An example photomask produced by the method 200 is shown and described with reference to FIGS. 3-8.

Figure 3:
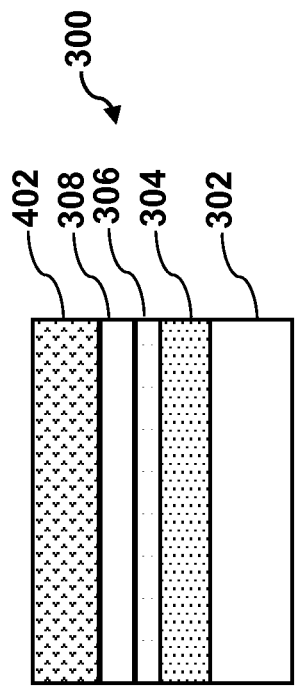

FIG. 3 illustrates a blank mask 300 for fabricating the self passivated hydrogenic capping layer photomask for haze defect growth suppression, such as would be produced at the end of step 204 (FIG. 2). The blank mask 300 includes a substrate 302. The substrate 302 may be made from fused silica, fused quartz, calcium fluoride ($CaF_2$), silicon carbide, black diamond, silicon oxide-titanium oxide ($SiO_2$—$TiO_2$) alloy and/or other suitable low thermal expansion material (LTEM) known in the art. A high degree of precision and purity on the surface and inside the body are desired when forming the substrate 302 because imperfections distort light transmitted through and reflected off the finished mask.

The blank mask 300 further includes an opaque layer 304 deposited over the LTEM substrate 302. The opaque layer 304 is formed such that an incident light beam will be fully absorbed by the deposited material. In the present embodiment, the opaque layer 304 includes a plurality of materials, such as MoSi, TaON, TaN, and/or suitable materials. The opaque layer 304 can be deposited on the low LTEM substrate 302 by sputter, chemical vapor deposition (CVD), physical vapor deposition (PVD), laser deposition, and/or atomic layer deposition (ALD).

Next, a capping layer 306 is deposited over the opaque layer 304. The capping layer 306 is formed such that it will react with ionic residue to produce self-forming efficiency surface modified layers to suppress haze or ionic defect growth during and/or after a photolithography process. In the present embodiment, the capping layer 306 includes a plurality of materials, such as metal oxide compounds (MOx), metal nitride compounds (MNx), or metal oxynitride compounds (MOxNy), where examples for M include Si, Ta, Ir, Ru, Hf, Os, or other transition metals. In the present, the crystalline state of the capping layer 306 can range amorphous to a fine crystal structure. The capping layer 306 can be deposited on opaque layer 304 by sputter, CVD, PVD, laser deposition, ion beam sputtering, and/or ALD.

Next, the hardmask layer 308 is deposited over the capping layer 306. The hardmask layer 308 is a scarified layer, which can transfer a pattern to the capping layer 306 and opaque layer 304 and can provide protection from etchants attacking the capping layer 306 and/or the opaque layer 304 during an etch process. Example materials for the hardmask layer 308 include Cr, CrN, CrO, and CrON. The hardmask layer 308 can be deposited over the capping layer 306 by sputter, CVD, PVD, laser deposition, and/or ALD.

Referring now to FIGS. 4-8, now that the mask blank 300 is performed as shown in FIG. 3, the mask is further processed to provide a self passivated hydrogenic capping layer and to form an atomic level hydrogen passivation layer to suppress haze defect growth.

Figure 4:
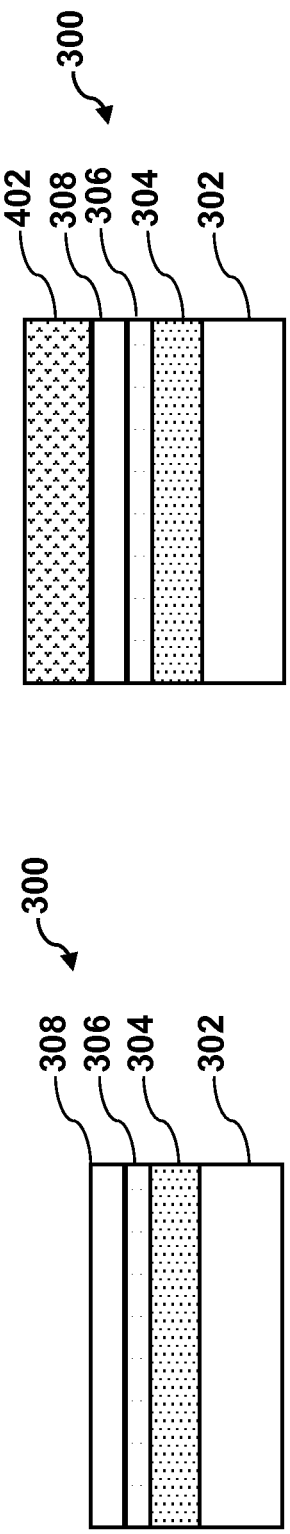

Referring to FIG. 4, a photoresist layer 402 is deposited over the hardmask layer 308 of the blank mask 300. The photoresist can be positive or negative resist and can be deposited over hardmask layer 308 using spin-on coating method per various coating tools.

Figure 5:
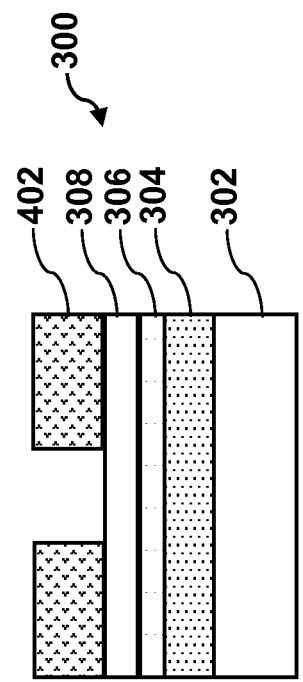

Referring to FIG. 5, the photoresist layer 402 is patterned to form a design layout. Typically the pattern is written on photoresist layer 402 using a mask writing technique such as electron beam writing, ion beam writing, or photolithography such as binary photolithography or phase-shift photolithography.

Referring to FIGS. 6 and 7, the patterned photoresist layer 402 transfers the design layout pattern to hardmask layer 308 using a plasma etching or wet etching process. The capping layer 306 is either resistant to the etch process, or includes an etch stop. A surface of the capping layer 306 is opened per the design layout after the etch process. The photo resist layer 402 can then be stripped by photoresist stripper, plasma or wet cleaning methods.

Referring to FIG. 8, the opened area capping layer 306 and the underlying opaque layer 304 are removed by dry etching or wet etching methods to expose the underneath substrate layer 302 using the patterned hardmask 308. The etching stops at substrate layer 302. The patterned hardmask layer 308 is then stripped by a wet cleaning method to form the final mask with a patterned capping layer 306 and opaque layer 304 per the design layout. Binary mask or phase shift masks used by the photolithography system 100 (FIG. 1) can be fabricated according to this embodiment.

When a conventional photomask is exposed to high energy radiation ranging from 350 nm UV blue line to 13.5 nm EUV light, N is released from a Mo—Si substrate of the photomask, and the N reacts with $H^+$ to form $NH_4^+$ and $NH_3$, which attach to the Mo—Si oxidation surface. The attached $NH_4^+$ and $NH_3$ on the Mo—Si oxidation surface can then react with $5O_4^{2-}$, which may be the residue from a cleaning process, to form haze or ionic crystal growth defects. The binding energy between $MoO_2$ and $NH_4^+$ is higher than the binding energy between $SiO_2$ and $NH_4^+$, and therefore the haze defects are more easily grown in the optical absorber layer than in the substrate region. The photomask discussed in the present disclosure prevents haze defects as discussed below.

In the present embodiment, an atomic level hydrogen passivation layer will be formed on the mask surface during high energy exposure. Environment surplus hydrogen or hydrogen functional ions such as from $NH_4^+$ or $NH_3$, will form and the surface will absorb these hydrogen ions as surface passivation reaction. The mechanism can be as below:

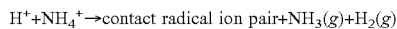

For example, assuming the capping layer 306 of the photomask comprises TaN or TaO, the chemical reactions in this embodiment can be described as below:

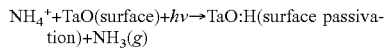

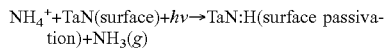

Once hydrogen is terminated in the absorber surface, dangling bond density and surface energy can be decreased, and therefore, ion interaction activity can be suppressed.

Thus, the present disclosure describes a unique photomask, such as a phase shift mask. In one embodiment, the photomask includes a low thermal expansion material (LTEM) substrate, a patterned opaque layer over the LTEM substrate, and a patterned capping layer over the opaque layer. The patterned capping layer includes a transition metal material for suppressing haze growth. Examples of the capping layer include metal oxide, metal nitride, and metal oxynitride.

The present disclosure also describes a unique method for making photomask. In one embodiment, the method of preparing a photomask includes depositing an opaque layer on a low thermal expansion material (LTEM) substrate and depositing a capping layer on the opaque layer. The capping layer includes a material for suppressing haze growth on a surface of the photomask. The method also includes depositing a scarified hardmask layer on the capping layer, patterning the scarified hardmask layer, and patterning the capping layer and opaque layer using the patterned scarified hardmask layer.

In another embodiment, a method of forming a photomask includes depositing an opaque layer above a low thermal expansion material (LTEM) substrate, depositing a capping layer above the opaque layer, and depositing a hardmask layer above the capping layer. The hard mask layer is patterned by a lithography and etching process. The method further includes patterning the capping and opaque layers using the patterned hardmask and a first etch and strip process and removing the patterned hardmask using a second etch process. The capping layer is made of a material which reacts with a hydrogenic compound that exists in a lithographic environment and thereby forms hydrogenic bonding on the capping layer surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of preparing a photomask, comprising:
   depositing an opaque layer on a low thermal expansion material (LTEM) substrate;
   depositing a capping layer on the opaque layer, wherein the capping layer includes a material for suppressing haze growth on a surface of the photomask;
   depositing a hardmask layer on the capping layer;
   patterning the hardmask layer; and
   patterning the capping layer and the opaque layer using the patterned hardmask layer.

2. The method according to claim 1, wherein the opaque layer includes MoSi, TaON, TaN, or combinations thereof, and is deposited on the LTEM substrate by one of a sputter deposition, a chemical vapor deposition (CVD), a physical vapor deposition (PVD), a laser deposition, and an atomic layer deposition (ALD) process.

3. The method according to claim 1, wherein the capping layer includes a metal oxide compound, wherein the metal oxide compound includes Si, Ta, Jr, Ru, Hf, Os, or other transition metal, and is deposited on the opaque layer by one of a sputter deposition, a chemical vapor deposition (CVD), a physical vapor deposition (PVD), a laser deposition, and an atomic layer deposition (ALD) process.

4. The method according to claim 1, wherein the capping layer includes a metal nitride compound, wherein the metal nitride compound includes Si, Ta, Jr, Ru, Hf, Os, or other transition metal, and is deposited on the opaque layer by one of a sputter deposition, a chemical vapor deposition (CVD), a physical vapor deposition (PVD), a laser deposition, and an atomic layer deposition (ALD) process.

5. The method according to claim 1, wherein the capping layer includes a metal oxynitride compound, wherein the metal oxynitride compound includes Si, Ta, Jr, Ru, Hf, Os, or other transition metal, and is deposited on the opaque layer by one of a sputter deposition, a chemical vapor deposition (CVD), a physical vapor deposition (PVD), a laser deposition, and an atomic layer deposition (ALD) process.

6. The method according to claim 1, wherein the hardmask layer includes Cr, CrN, CrO, CrON, or combinations thereof, and is deposited on the opaque layer by one of a sputter deposition, a chemical vapor deposition (CVD), a physical vapor deposition (PVD), a laser deposition, and an atomic layer deposition (ALD) process.

7. The method according to claim 1, wherein the hardmask layer is patterned using a mask writing technique.

8. The method according to claim 1, wherein patterning the capping layer and the opaque layer includes etching using the patterned hardmask with an etchant that is selective to the capping layer and the opaque layer, and thereafter stripping the patterned hardmask with an etchant that is not selective to the capping layer and the opaque layer.

9. A method comprising:
   receiving a low thermal expansion material (LTEM) substrate;
   forming a patterned opaque layer directly coupled to the LTEM substrate; and
   forming a patterned capping layer directly coupled to the patterned opaque layer, wherein the patterned capping layer includes a material for suppressing haze growth.

10. The method of claim 9, wherein the LTEM substrate includes one or more selected from the group consisting of quartz, silicon, silicon carbide, calcium fluoride ($CaF_2$), and silicon oxide-titanium oxide alloy ($SiO_2$-$TiO_2$).

11. The method of claim 9, wherein the patterned opaque layer includes one or more selected from the group consisting of MoSi, TaON, and TaN.

12. The method of claim 9, wherein the patterned capping layer includes an oxide compound, the oxide compound including one selected from the group consisting of Si, Ta, Ir, Ru, Hf, and Os.

13. The method of claim 9, wherein the patterned capping layer includes a nitride compound, the nitride compound including one selected from the group consisting of Si, Ta, Ir, Ru, Hf, and Os.

14. The method of claim 9, wherein the patterned capping layer includes an oxynitride compound, the oxynitride compound including one selected from the group consisting of Si, Ta, Ir, Ru, Hf, and Os.

15. The method of claim 9, wherein the patterned capping layer includes a crystalline state between amorphous and fine crystal, inclusive.

16. The method of claim 9, wherein the patterned capping layer is configured to react with ionic residue and thereafter form a self-passivated hydrogen capping layer to suppress haze or ionic defect growth on a photomask surface during or after a deep ultraviolet (DUV) or extreme ultraviolet (EUV) lithography process.

17. The method of claim 9, wherein the photomask is one of a binary mask and a phase shift mask.

18. The method of claim 9, wherein the photomask includes a binary mask, an alternative phase shift mask (alt. PSM) portion, or an attenuated phase shift mask (att. PSM) portion.

19. A method of preparing a photomask for suppressing haze growth, comprising:
 forming a patterned opaque layer directly over a low thermal expansion material (LTEM) substrate; and
 forming a patterned capping layer directly over the patterned opaque layer, wherein the patterned capping layer includes a transition metal and nitrogen.

20. The method of claim 19, wherein the transition metal is selected from the group consisting of Ta, Jr. Ru, Hf, and Os.

* * * * *